(12) United States Patent
Shimogawa et al.

(10) Patent No.: US 6,584,660 B1
(45) Date of Patent: *Jul. 1, 2003

(54) METHOD OF MANUFACTURING A PIEZOELECTRIC DEVICE

(75) Inventors: Natsumi Shimogawa, Nagoya (JP); Koji Kimura, Nagoya (JP); Yukihisa Takeuchi, Nishikamo-Gun (JP)

(73) Assignees: NGK Indulators, LTD (JP); Seiko Epson Corp. (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/257,020

(22) Filed: Jun. 8, 1994

(30) Foreign Application Priority Data

Jun. 8, 1993 (JP) .............................................. 5-163945

(51) Int. Cl.⁷ .......................... H04R 17/00; H04R 17/10; B21D 53/76
(52) U.S. Cl. ................ 29/25.35; 29/890.1; 219/121.69; 347/68; 347/71; 310/328; 310/330; 310/331
(58) Field of Search ........................ 310/328, 357–359, 310/330–332, 366, 367, 368; 347/68, 71; 29/25.35, 890.1, 852; 219/121.68, 121.69

(56) References Cited

U.S. PATENT DOCUMENTS

| 4,551,647 A | * | 11/1985 | Day ........................... 29/25.35 |
| 4,641,153 A | * | 2/1987 | Cruz-Uribe ............. 310/368 X |
| 4,819,014 A | * | 4/1989 | Yasuhara et al. ............. 347/68 |
| 4,937,597 A | * | 6/1990 | Yasuhara et al. ............. 347/71 |
| 5,057,664 A | * | 10/1991 | Johnson et al. ........ 219/121.69 |
| 5,072,240 A | * | 12/1991 | Miyazawa et al. ...... 310/331 X |
| 5,210,455 A | * | 5/1993 | Takeuchi et al. ............ 310/328 |

FOREIGN PATENT DOCUMENTS

| EP | 0468796 | | 1/1992 | |
| JP | 59-42193 | * | 3/1984 | ............ 219/121.69 |
| JP | 1-188350 | * | 6/1987 | ................ 29/890.1 |

OTHER PUBLICATIONS

D'Ambra et al, Via formation in Green Ceramic Dielectrics using a YAG laser, Electronic Component and Technology Conference, pp. 1072–1081, May 1992.*

Patent Abstracts of Japan, vol. 009, No. 266 (E–352) Oct. 23, 1985 & JP–A– 60 111 600 (Mitsubishi Kogyo Cement KK) Jun. 18, 1985.

* cited by examiner

Primary Examiner—A. Dexter Tugbang
(74) Attorney, Agent, or Firm—Parkhurst & Wendel, L.L.P.

(57) ABSTRACT

A method for making a piezoelectric device wherein residual stresses in the piezoelectric transducer element of the piezoelectric device are relieved by forming a groove or grooves extending into a thick-walled region of the peripheral wall of a ceramic substrate in the piezoelectric device. The stresses to be relieved are caused by a difference in shrinkage between the ceramic substrate and the piezoelectric transducer as a result of sintering the substrate and the transducer to form an integral product.

13 Claims, 8 Drawing Sheets

FIG_1
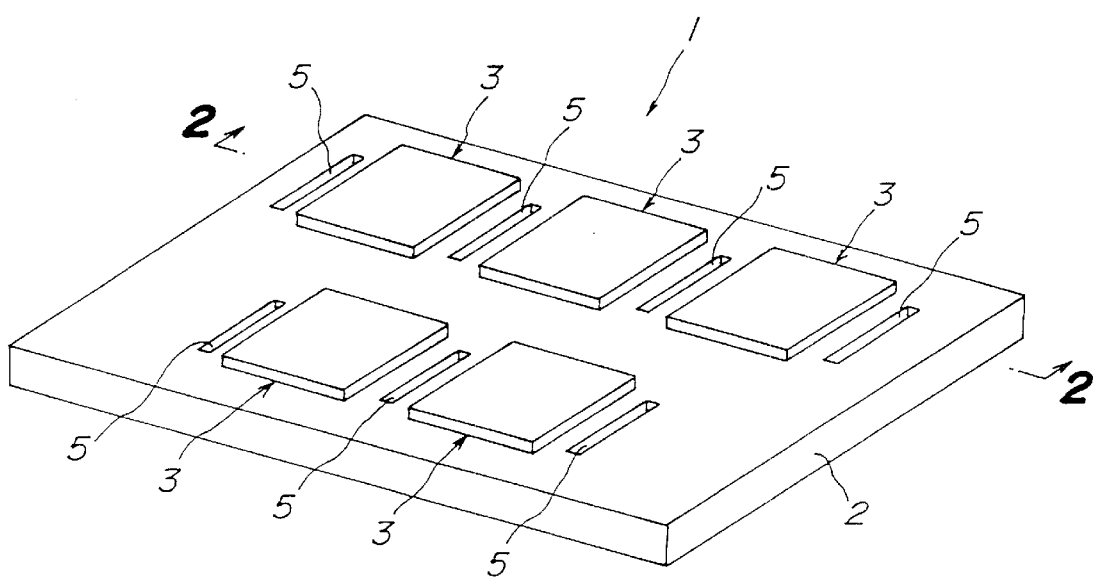

FIG_2A
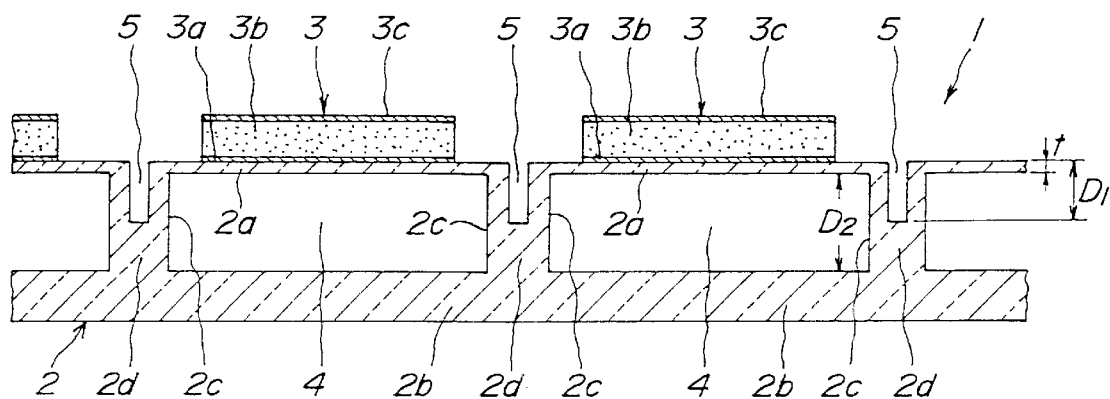
FIG_2B
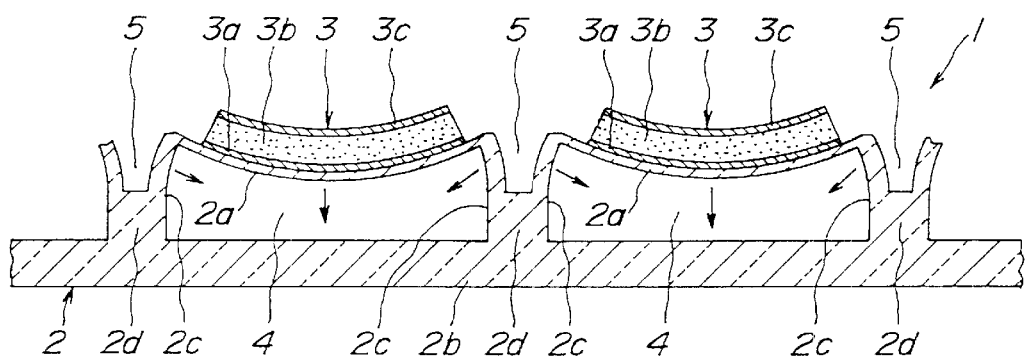

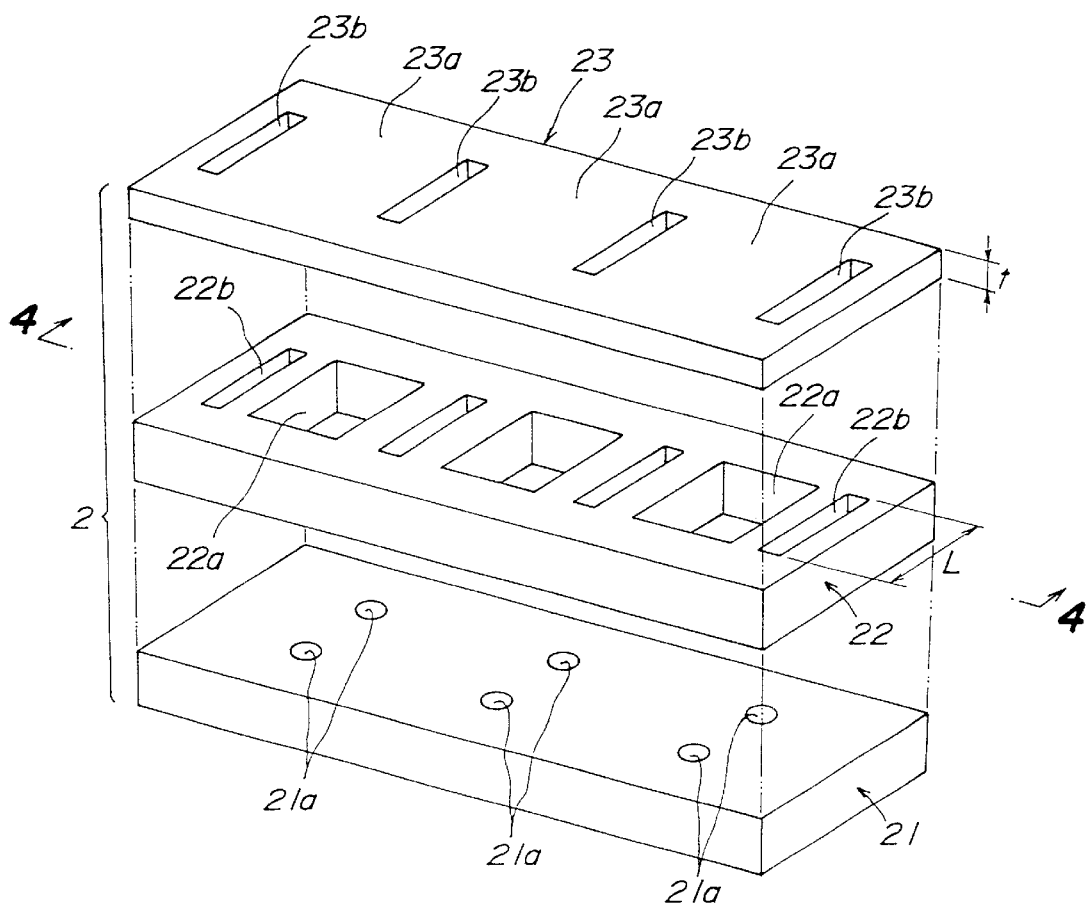
FIG_3
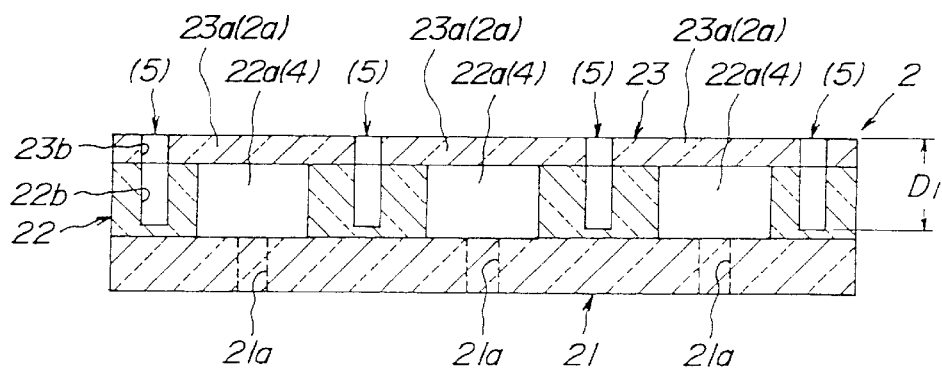
FIG_4

FIG_5A  PRIOR ART
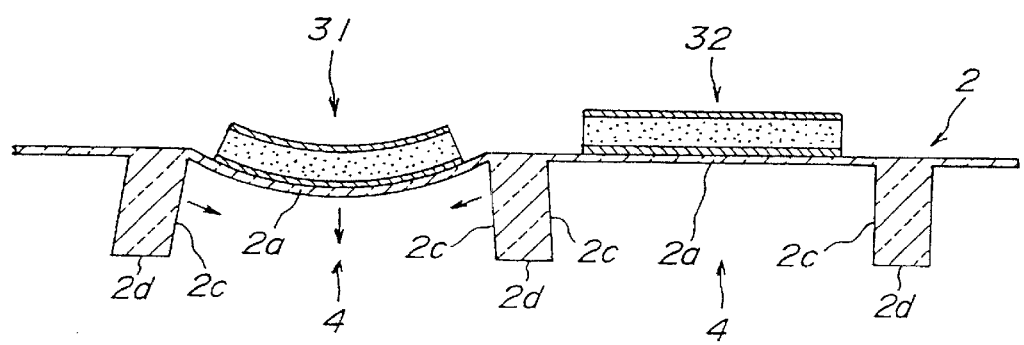
FIG_5B
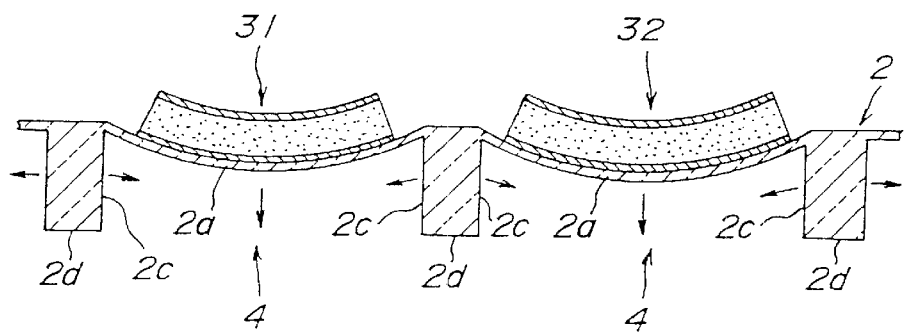
PRIOR ART

FIG_6A
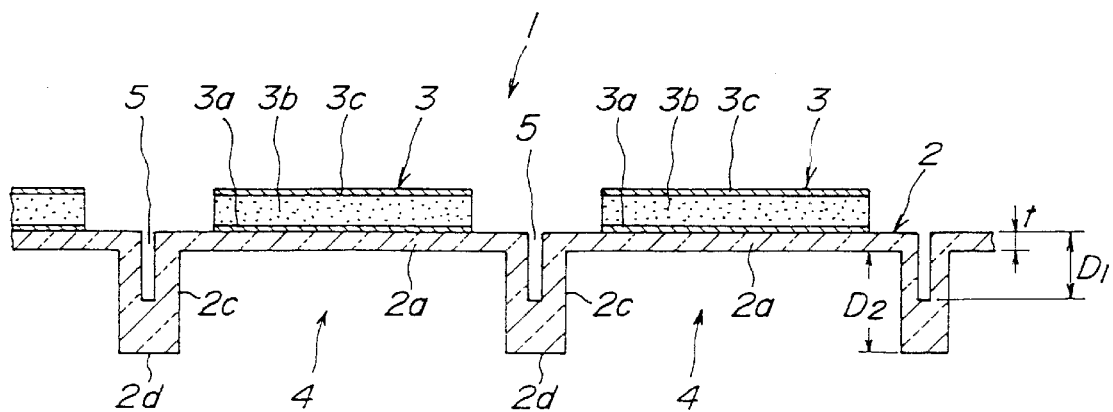
FIG_6B
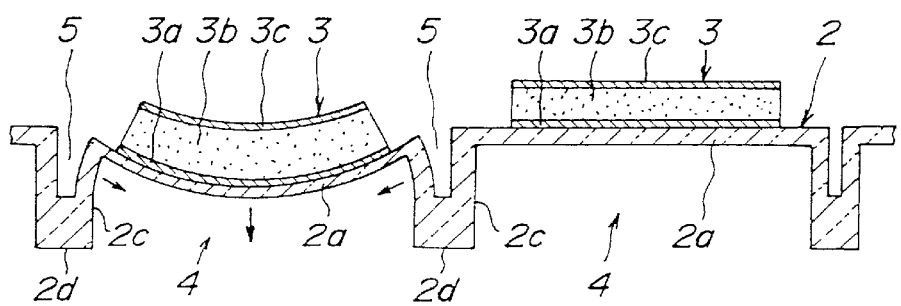
FIG_6C
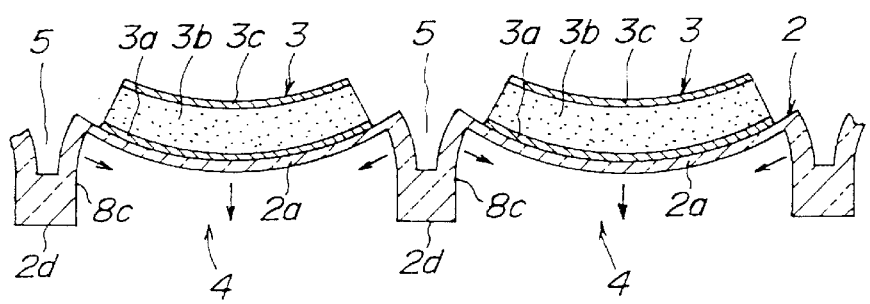

FIG_7
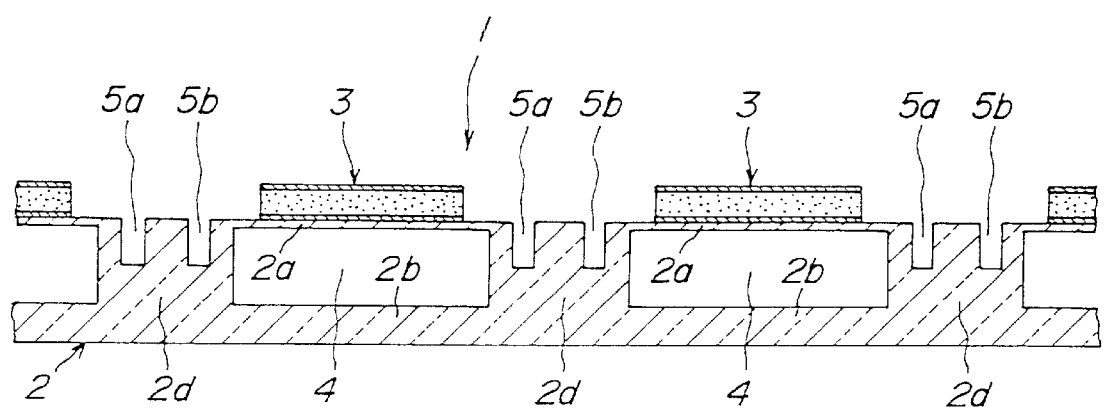

FIG_8
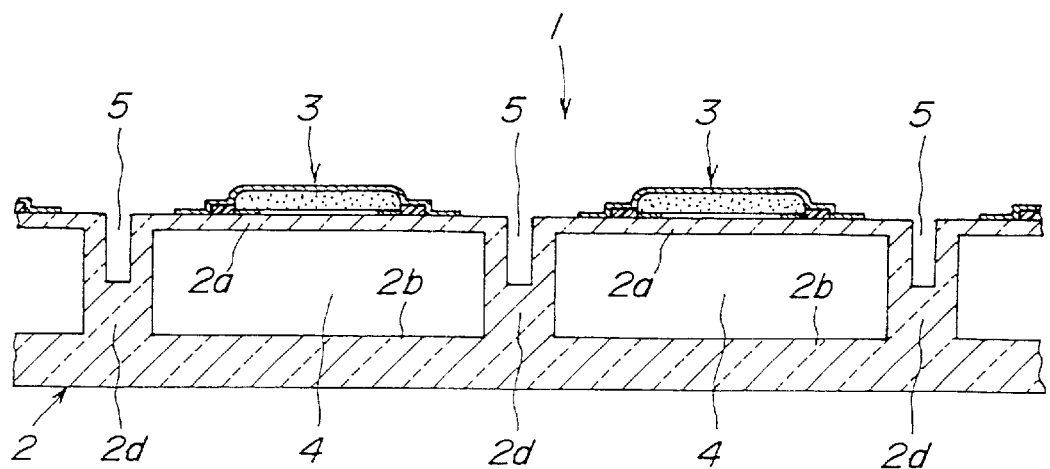
FIG_9
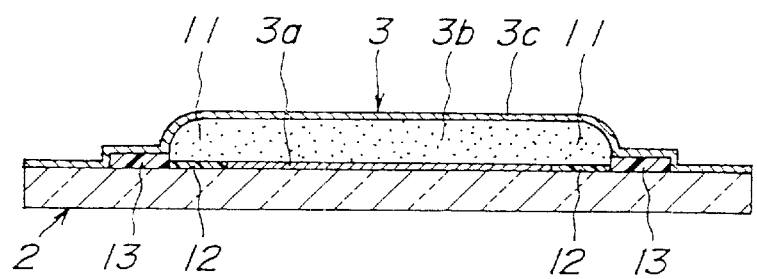

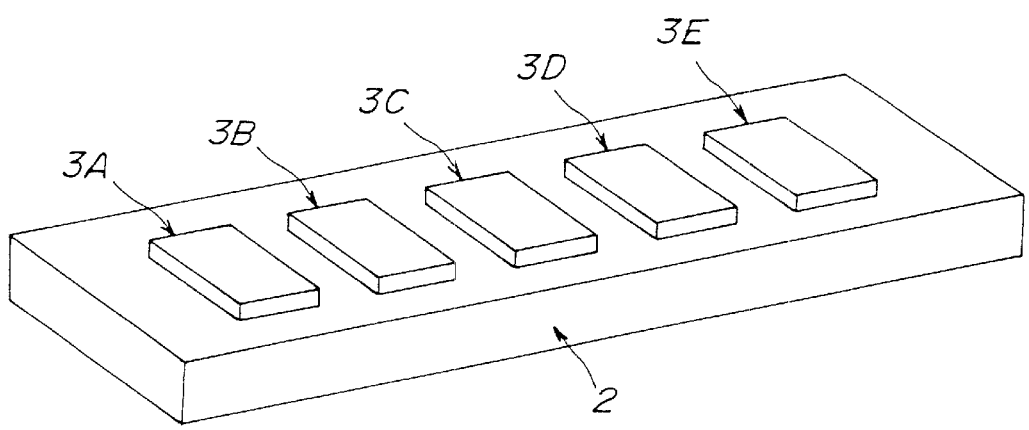
FIG_10

METHOD OF MANUFACTURING A PIEZOELECTRIC DEVICE

BACKGROUND OF THE INVENTION

1. Field of the Invention

The present invention relates to a piezoelectric device for converting an input mechanical quantity into an output electrical quantity, and vice versa.

2. Description of the Related Art

As generally known in the art, piezoelectric devices are typically used to convert an input mechanical stress into an output electric charge (voltage) and also to convert an input electric voltage into an output mechanical distortion. In the latter case, the device is sometimes referred to as an electrostrictive device. The term "piezoelectric device" as used herein is to be interpreted in its broadest sense, as encompassing an electrostrictive device as well. Similarly, the term "piezoelectric material" as used herein is to be interpreted in its broadest sense as encompassing an electrostrictive material as well. When the output of the piezoelectric device is a mechanical distortion, such distortion can be used to generate mechanical force, displacement or vibration.

Conventionally, piezoelectric devices have been used for various purposes. For example, in the field of optics or precision engineering, there is a progressive demand for actuators capable of adjusting lengths and/or positions of the optical path on a sub-micron order, or for sensors capable of detecting a fine mechanical displacement. There have been various proposals directed to such demands in conjunction with application of piezoelectric devices. Specifically, there is known unimorph- or bimorph-type piezoelectric device which undergoes bending or flexural deformation upon application of an input electrical voltage, and which can be used for ink jet printing heads, acoustic radiators (i.e., loudspeakers and the like), vibrators, etc. The unimorph- or bimorph-type piezoelectric device can also be used to convert a bending or flexural deformation into an electrical voltage, e.g., a microphone or sensor. With reference, for example, to ink jet printing heads including a unimorph- or bimorph-type piezoelectric device, in view of customers' or end users' requirement for high-quality and high-speed printing performance, it is highly desirable to realize a high density piezoelectric device having a minimized size, which operates at a low driving voltage and yet provides a satisfactory response characteristic and an operational reliability.

For realizing the above-mentioned desired properties of the piezoelectric device, because the substrate in the region of each piezoelectric transducer functions as a diaphragm, it has been generally considered necessary for the entire substrate to have a reduced thickness. In many instances, however, the reduced thickness of the substrate as a whole cannot be achieved without lowering the mechanical strength of the substrate. Thus, in order to simultaneously satisfy the seemingly incompatible requirements for the reduced thickness and a satisfactory mechanical strength of the substrate, U.S. Pat. No. 5,210,455 assigned to the assignee of this application discloses an improved piezoelectric device which includes a locally thin-walled substrate and piezoelectric transducers formed on, and integrated with the thin-walled regions of the substrate.

As particularly disclosed in U.S. Pat. No. 5,210,455, the locally thin-walled substrate may be formed by laminating a relatively thick green sheet of a first ceramic layer having window-like openings therein, and a relatively thin green sheet of a second ceramic layer without such openings. After integrating the two ceramic layers by firing to form the substrate, the openings in the first ceramic layer cooperate with the second ceramic layer to define cavities having thin-walled bottom walls which are constituted by the second ceramic layer. Furthermore, the piezoelectric transducers may each include a first electrode layer, a piezoelectric layer and a second electrode layer which are sequentially laminated with each other. The piezoelectric transducers are arranged on those outer surface regions of the substrate opposite to the relevant cavities, and are integrated with the substrate by firing.

The piezoelectric device according to the above-mentioned proposal proved to be highly advantageous in that the locally thin-walled regions of the substrate opposite to the respective piezoelectric transducers make it possible to achieve a satisfactory operation of the transducers, and further in that the remaining, relatively thick region of the substrate serves to realize a sufficient mechanical strength of the substrate as a whole.

Nevertheless, it would be highly desirable to provide a further improved piezoelectric device which is superior in the operational characteristics, and which yet retains the above-mentioned advantages. Having thus conducted thorough experiments and investigations based on the piezoelectric device disclosed in U.S. Pat. No. 5,210,455, the inventors reached a recognition that a significant improvement can be achieved by carefully taking into consideration the physical and/or chemical properties, structure and behavior of the substrate and the piezoelectric transducers at or near the thin walled regions of the substrate.

First of all, in the piezoelectric device according to the inventors' earlier proposal, the substrate and the piezoelectric transducer are generally composed of materials which are different in chemical composition and hence in the coefficient of thermal expansion. Thus, during manufacture of the piezoelectric device, in particular during cooling which follows the sintering for forming the piezoelectric transducer on the substrate or the firing for integrating the substrate and the piezoelectric transducer, undesirable residual stresses tend to be caused in the piezoelectric transducer, which may deteriorate the operational characteristics of the device as a whole. According to a recognition reached by the inventors, a highly improved piezoelectric device can be realized by effectively compensating for the difference in shrinkage of the materials for the substrate and the piezoelectric transducer.

Furthermore, in the piezoelectric device according to the inventors' earlier proposal wherein a common substrate is provided with an array comprising a plurality of piezoelectric transducers, when neighbouring transducers are simultaneously actuated, it is often difficult to achieve a sufficient amount of displacement of the thin-walled regions of the substrate in a direction perpendicular to the general surface of the substrate, and a satisfactory volumetric change of the cavity. Besides, the operation of the transducers may be affected by the operation of adjacent transducers, making it difficult to uniformly achieve a desired displacement amount of the thin-walled regions of the substrate. According to another recognition reached by the inventors, a highly improved piezoelectric device can be realized by eliminating or suppressing undesired interaction of the neighbouring transducers.

Specifically, it has been confirmed that when the piezoelectric device according to the inventors' earlier proposal is used, for example, as an actuator for an ink jet printing head, there may be instances wherein the ink filled within the cavity cannot be discharged with a sufficient amount or at a high speed, or wherein it is difficult to achieve a satisfactory printing quality. According to still another recognition reached by the inventors, significantly improved ink discharge characteristics can be achieved by realizing a sufficient displacement characteristic of the piezoelectric transducer and a satisfactory volumetric change of the cavity. It has also been recognized that a significantly improved printing quality can be realized by eliminating or minimizing fluctuation in the displacement characteristics of the piezoelectric transducers and hence in the discharge amount and speed of ink.

DISCLOSURE OF THE INVENTION

The present invention thus contemplates providing a highly improved piezoelectric device on the basis of the above-mentioned recognitions.

It is a primary object of the present invention to provide a highly improved piezoelectric device which makes it possible to achieve a sufficient displacement amount of the thin-walled region of the substrate and a satisfactory volumetric change of the cavity.

It is another object of the present invention to provide a highly improved piezoelectric device which is capable of effectively relieving the stresses in the piezoelectric transducer, which may arise from the difference in shrinkage of the substrate and the piezoelectric transducer due to the difference in the coefficient of thermal expansion of the materials, or from the shrinkage of the piezoelectric transducer upon sintering of the transducer on the substrate.

It is still another object of the present invention to provide a highly improved piezoelectric device provided with an array comprising a plurality of piezoelectric transducers, which is capable of eliminating or suppressing undesired interaction of the neighbouring transducers.

Briefly stated, the piezoelectric device according to the present invention comprises a ceramic substrate with an outer surface and an inner surface, of which the inner surface is locally formed with at least one cavity which is defined by at least one peripheral wall and a bottom wall having a reduced thickness. The device further comprises at least one film-type piezoelectric transducer which is formed integrally with the substrate and arranged on the outer surface opposite to the bottom wall. The outer surface of the substrate has a thick-walled region adjacent to and surrounding the peripheral wall of the cavity. The thick-walled region is formed with at least one groove which extends along the peripheral wall of the cavity. The groove has a depth which is greater than the thickness of the bottom wall. The groove is arranged so as to permit simultaneous displacements of the bottom wall and the thick-walled region between the cavity and the groove, to thereby cause a volumetric change of the cavity.

The above-mentioned arrangement of the piezoelectric device according to the present invention features the formation of at least one groove in the relatively thick-walled region of the substrate adjacent to and surrounding the peripheral wall of the cavity. Because the groove extends along the peripheral wall of the cavity and has a depth which is greater than the thickness of the bottom wall of the cavity, it is possible to provide a higher compliance of the relatively thick-walled substrate region adjacent to the peripheral wall of the cavity, with which the thin-walled regions of the substrate can be readily deformed upon firing shrinkage during manufacture of the device. Therefore, despite the difference in the coefficient of thermal expansion of the materials for the substrate and the piezoelectric transducer, the transducer during manufacture of the device can be subjected to the firing shrinkage in a relatively unrestricted sense, thereby minimizing the residual stresses in the transducer and assuring highly improved operational characteristics of the device.

Moreover, when the piezoelectric device according to the present invention includes an array of piezoelectric transducers formed on a common substrate, the groove in the relatively thick-walled region of the substrate can be advantageously situated between neighbouring transducers to provide a low vibration transmissibility of the substrate between adjacent transducers. This serves to effectively eliminate or suppress undesirable interaction or crosstalk between the transducers, and makes it readily possible to uniformly achieve a desired amount of displacement of the thin-walled regions of the substrate in a direction perpendicular to the general surface of the substrate.

BRIEF DESCRIPTION OF THE DRAWINGS

The present invention will now be explained in further detail, by referring to the accompanying drawings in which:

FIG. 1 is a perspective view showing the piezoelectric device according to a first embodiment of the present invention;

FIGS. 2A and 2B are sectional views taken along the line 2—2 in FIG. 1;

FIG. 3 is an exploded perspective view showing one example of a multi-layered substrate of the device;

FIG. 4 is a sectional view taken along the line 4—4 in FIG. 3;

FIGS. 5A and 5B are sectional views showing the operation of a known piezoelectric device;

FIGS. 6A, 6B and 6C are sectional views showing the piezoelectric device according to a second embodiment of the present invention;

FIG. 7 is a sectional view showing the piezoelectric device according to a third embodiment of the present invention;

FIG. 8 is a sectional view showing the piezoelectric device a fourth embodiment of according to the present invention;

FIG. 9 is a sectional view in enlarged scale, showing the detailed arrangement of the piezoelectric transducer in the embodiment of FIG. 8; and FIG. 10 is a perspective view showing the arrangement of the piezoelectric device with which experiments were conducted.

For the sake of convenience, the same reference numerals are used throughout the figures to denote same or equivalent elements.

DETAILED DESCRIPTION OF THE PREFERRED EMBODIMENTS

Referring now to FIGS. 1 to 4, there is shown a first embodiment of the unimorph-type piezoelectric device according to the present invention, which is denoted as a whole by reference numeral 1. The piezoelectric device 1 includes a locally thin-walled ceramic substrate 2 and a plurality of piezoelectric transducers 3 arranged on the upper surface of the substrate 2. More particularly, the substrate 2 has a plurality of thin-walled regions 2a and the piezoelectric transducers 3 are arranged on the thin-walled regions 2a. The substrate 2 has a plurality of closed cavities 4 therein, each defined by a closure wall 2b on the lower surface side of the substrate 2, peripheral walls 2c in the substrate 2 and a bottom wall on the upper surface side of the substrate 2, of which the bottom wall is constituted by the thin-walled region 2a of the substrate 2. The bottom wall 2a functions as a diaphragm of the piezoelectric transducer 3 in operation of the device 1. The substrate 2 has relatively thick-walled regions 2d adjacent to the thin-walled regions 2a, where it is formed with grooves 5 each arranged to extend along the peripheral wall 2c of the cavity 4 and to open at the upper surface of the substrate 2.

As shown in FIG. 2A, the piezoelectric transducers 3 may be formed integrally with the substrate 2 by an ordinary film-formation process to be more fully described hereinafter, wherein a lower electrode layer 3a, a film-shaped piezoelectric layer 3b and an upper electrode layer 3c are sequentially laminated one above the other. As further shown in FIGS. 3 and 4, the substrate 2 may be formed by known lamination process, wherein a lower green sheet 21 providing the closure wall 2b of the substrate 2, an intermediate green sheet 22 formed with window-like openings 22a corresponding to the cavity 4, and a thin-walled upper green sheet 23 providing the bottom wall 2a of the cavity 4, are sequentially laminated one above the other and subjected to a sintering to form an integrated substrate 2 (FIG. 4).

The particulars of the three green sheets 21, 22, 23 forming the integrated substrate 2 will be explained below, with reference to FIGS. 3 and 4. The upper green sheet 23 has flat regions 23a corresponding to the bottom walls 2a of the substrate 2, and slit-like openings 23b extending through the upper green sheet 23 in the direction of its thickness. The intermediate green sheet 22 has, besides the window-like openings 22a, slit-like grooves 22b with their bottoms situated close to the lower green sheet 21. The upper green sheet 23 and the intermediate green sheet 22 are superimposed with each other so that the slit-like openings 23b in the upper green sheet 23 and the slit-like grooves 22b in the intermediate green sheet 22 are brought into alignment with each other to form the groove 5 in the substrate 2. When the piezoelectric device 1 is used as an actuator for an ink jet printing head, the lower green sheet 21 may have through-holes 21a to be used as an inlet which is in communication with an ink reservoir and/or as an outlet which is in communication with a discharge nozzle.

With further reference to FIGS. 3 and 4, assuming by way of example that the cavity 4 has a square contour, the groove 5 in the substrate 2 has a length L which is at least ⅛, preferably ¼ or more, of the length of the longitudinal edge of the cavity 4.

Furthermore, as shown in FIG. 2A, the groove 5 has a depth $D_1$ which is substantially the same as, or greater than the thickness t of the thin-walled bottom wall 2a of the cavity 4, and which preferably satisfies the following equation (1):

$$D_1 \geq (t + D_2/3) \quad (1)$$

where $D_2$ is the depth of the cavity 4. More preferably, the depth $D_1$ of the groove 5 satisfies the following equation (2):

$$D_1 \geq (t + 2 \times D_2/3) \quad (2)$$

Advantageously, the groove 5 has a width $W_1$ as also shown in FIG. 2A, which is determined such that the width $W_2$ of the thick-walled region 2d measured between the side wall of the groove 5 and the opposite peripheral wall 2c of the cavity 4 is within a range between 20 μm and 200 μm, preferably between 20 μm and 100 μm. When the width $W_2$ of the thick-walled region 2d is less than 20 μm, the stiffness of the thick-walled region 2d is often excessively lowered, making it difficult to effectively induce the desired vertical displacement of the bottom wall 2a of the cavity 4 and thereby achieve an efficient volumetric change of the cavity 4. Moreover, cracks or the like defects tend to occur in the thick-walled region 2d during formation of the groove 5, making it difficult to improve the manufacturing productivity of the piezoelectric device. When, on the other hand, the width $W_2$ of the thick-walled region 2d is more than 200 μm, it becomes often difficult to achieve a sufficient stress relaxation during firing of the piezoelectric film layer, and hence to effectively improve the properties of the piezoelectric material. Moreover, due to the increased stiffness of the thick-walled region 2d, it becomes difficult to achieve a sufficient lateral displacement of the peripheral wall 2c of the cavity 4 thereby to enable a large volumetric change of the cavity 4.

It has to be noted in this connection that the above-mentioned preferred range of the width $W_2$ is applicable also when two or more grooves 5 are formed in each thick-walled region 2d of the substrate 2.

The grooves 5 may have a square cross-section as shown in FIGS. 2A and 4, or other appropriate cross-section such as V-shaped or trapezoid cross-section.

As for the thickness of the thin-walled region 2a of the substrate 2, i.e., the bottom wall of the cavity 4, which functions as the diaphragm of the piezoelectric transducer 3, in order to provide an improved high-speed response characteristic and a high conversion efficiency of the transducer 3, the thin-walled region 2a has a thickness which is preferably 50 μm or less, more preferably 30 μm or less, and further more preferably 10 μm or less.

The piezoelectric device 1 according to the present invention includes groove 5 in the relatively thick-walled region 2d of the substrate 2 adjacent to and surrounding the peripheral wall 2c of the cavity 4. It is therefore possible to provide a higher compliance of the relatively thick-walled substrate region 2d adjacent to the peripheral wall 2c of the cavity 4, with which the thin-walled regions 2a of the substrate 2 can be readily deformed upon firing shrinkage during manufacture of the device 1. This means that the transducer 3 during manufacture of the device 1 can be subjected to the firing shrinkage in a relatively unrestricted sense, thereby minimizing the residual stresses in the transducer 3 and assuring a highly improved operational characteristics of the device 1. As a result, it is possible to provide improved characteristics of the transducer 3, including the relative dielectric constant, and to more fully make use of material properties which are inherent to the piezoelectric material.

As can be further appreciated from FIG. 2B, formation of the grooves 5 in the thick-walled regions 2d of the substrate 2 ensures that the diaphragm of the piezoelectric transducer 3 constituted by the bottom wall 2a of the cavity 4 can be sufficiently displaced vertically toward the closure wall 2b, simultaneously inducing lateral displacements of the opposite peripheral walls 2c toward the center of the cavity 4. A resultant higher compliance of the diaphragm of the piezoelectric transducer 3, in combination with the lateral displacements of the opposite peripheral walls 2c, permits a rapid volumetric change of the cavity and serves to provide a significantly increased discharge amount of ink from the cavity 4.

Moreover, when the piezoelectric device 1 according to the present invention includes an array of piezoelectric transducers 3 formed on a common substrate 2, the grooves 5 formed in the relatively thick-walled regions 2d of the substrate 2 and situated between the adjacent transducers 3 provide a low vibration transmissibility of the substrate 2 between the adjacent transducers 3. The grooves 5 thus serve to effectively eliminate or suppress undesirable interaction or crosstalk between adjacent transducers 3, and to make it readily possible for the thin-walled regions 2a of the substrate 2 to achieve a uniform amount of the desired vertical displacement. Furthermore, even when neighbouring transducers 3 are simultaneously actuated, the groove 5 serves to absorb tensile forces between the transducers to thereby minimize the fluctuation in the vertical displacement.amounts of the diaphragms.

For the sake of comparison, FIGS. 5A and 5B schematically illustrate the operation of the piezoelectric device according to the above-mentioned U.S. Pat. No. 5,210,455, which is provided with a plurality of piezoelectric transducers 31, 32 on a ceramic substrate 2 having open cavities 4 which are not closed by a closure wall on the lower surface side of the substrate 2.

As shown in FIG. 5A, when only the piezoelectric transducer 31 is actuated, the bottom wall 2a of the substrate 2 undergoes a vertical displacement which is assisted by slight lateral displacements of the thick-walled regions 2d forming the opposite peripheral walls 2c of the cavity 4. However, when adjacent piezoelectric transducers 31, 32 are simultaneously actuated, as can be appreciated from FIG. 5B, the lateral forces applied to the thick-walled region 2d between these transducers 31, 32 are cancelled with each other, thereby giving rise to a tendency of more or less impeding the desired vertical displacements of the bottom walls 2a of the substrate 2. The vertical displacement amount achieved by the diaphragm of the transducer in such operational state is reduced, as compared to the situation when a single transducer only is actuated.

When the piezoelectric device according to the present invention is used, e.g., as an actuator for an ink jet printing head, an insufficient vertical displacement amount of the diaphragm often results in a low ink discharge amount. It has been further found that the different displacement amount of the diaphragm depending upon the operational state of the device tends to cause fluctuation in the operational characteristics of the device. Moreover, due to the rigidity of the thick-walled region 2d between adjacent transducers 31, 32, there may be caused an undesirable interaction or crosstalk between the transducers. These problems are more significant when the substrate 2 of the device 1 has a higher rigidity due to the formation of closed cavities which are closed by closure walls like that shown in FIG. 2A.

The present invention thus provides a unique solution for the above-mentioned problems, by forming at least one groove 5 in the thick-walled region 2d of the ceramic substrate 2.

A second embodiment of the unimorph-type piezoelectric device according to the present invention is shown in FIGS. 6A, 6B and 6C, which is similar to, and directly comparable with the known device shown in FIGS. 5A and 5B, in that the substrate 2 has open cavities 4. Formation of the grooves 5 in the thick-walled regions 2d of the substrate 2 makes it possible to provide a higher compliance of the diaphragm 2a and a resultant increased amount of its vertical displacement in operation of the device. As can be appreciated from FIGS. 6B and 6C, the grooves 5 between adjacent transducers serve to effectively suppress interaction or crosstalk between the transducers, and the vertical displacement amount of the diaphragm 2a can be uniformly maintained substantially uninfluenced by the operational state of the device, i.e., regardless of whether one transducer only is actuated (FIG. 6B) or adjacent transducers are simultaneously actuated (FIG. 6C).

A third embodiment of the unimorph-type piezoelectric device according to the present invention is shown in FIG. 7, in which each thick-walled region 2d of the substrate 2 is relatively wide and formed with two grooves 5a, 5b of which the depth is greater than the thickness of the bottom wall 2a of the cavity 4. This embodiment effectively provides an improved compliance of the diaphragm 2a of the piezoelectric transducer 3, particularly when a plurality of transducers 3 are arranged on the substrate 2 with a relatively wide pitch.

A fourth embodiment of the unimorph-type piezoelectric device according to the present invention is shown in FIGS. 8 and 9, which is also provided with the grooves 5 in the thick-walled regions 2d of the substrate 2. This embodiment is similar to the device disclosed in the applicants' copending U.S. patent application Ser. No. 08/206,939 or European Patent Application No. 94 301 633.7, of which the disclosure is hereby incorporated by reference.

More particularly, as shown in FIG. 9, the piezoelectric device 1 according to the illustrated embodiment includes piezoelectric transducers 3 of which the piezoelectric layer 3b has a dimension which is sufficient to substantially completely cover the lower electrode layer 3a. The piezoelectric layer 3b has at least one edge 11 in the form of an extension protruding beyond the lower electrode layer 3a, which is at least locally incompletely bonded to the ceramic substrate 2, as shown at 12. The term "incomplete bond" as used herein refers to a specific bonded state between the ceramic substrate 2 and at least one edge 11 of the piezoelectric layer 3b, which allows the piezoelectric layer 3b to undergo a substantially unrestricted movement relative to the substrate 2. Adjacent to the edges 11 of the piezoelectric layer 3b, there may be provided buffer resin layers 13 between the upper electrode layer 3c and the substrate 2, so as to provide a smooth and flexible connection of the upper electrode layer 3c to the substrate 2 and thereby protect the upper electrode layer 3c from possible damages due to impact or vibration during the production of the device or in the use condition.

The above-mentioned arrangement of the piezoelectric device 1 shown in FIGS. 8 and 9 makes it readily possible to manufacture the piezoelectric device with an improved productivity, because it is not necessary to precisely align the edges of the piezoelectric layer 3b with those of the lower electrode layer 3a. The edges 11 of the piezoelectric layer 3b of the device 1 shown in FIGS. 8 and 9 serve to avoid short-circuit between the lower and upper electrode layers 3a, 3c. Moreover, the incompletely bonded regions 12 between the ceramic substrate 2 and the edge 11 of the piezoelectric layer 3b protruding beyond the lower electrode layer 3a allows the piezoelectric layer 3b to be moved relative to the substrate 2 in an unrestricted sense. It is thus possible to achieve satisfactory reliability and functions of the device, e.g., generation of large force or displacement, or of high output voltage level.

It should be noted that the present invention may also be applied to a piezoelectric device which includes a single piezoelectric transducer formed on the substrate. In this instance also, formation of the grooves in the thick-walled regions of the substrate adjacent to the thin-walled bottom wall of the cavity serve to provide a higher compliance of the bottom wall and hence significantly improved operational characteristics of the device.

In order to realize highly improved operational characteristics of the piezoelectric device according to the present invention, the substrate 2 preferably comprises zirconium oxide as a main component, having a crystal phase that has been completely or partially stabilized preferably by the addition of at least one compound selected from a group consisting of yttrium oxide, cerium oxide, magnesium oxide and calcium oxide.

The amount of the additives required for partially or completely stabilizing the zirconium oxide as described above may be 1–30 mol % for yttrium oxide, 6–50 mol % for cerium oxide, and 5–40 mol % for the magnesium oxide and calcium oxide. As for yttrium oxide in particular, the amount is preferably 2–7 mol %, more preferably 2–4 mol %, because the zirconium oxide added with the yttrium oxide of such amount has a partially stabilized crystal phase and thus exhibits particularly excellent substrate characteristics.

A preferred method of forming the ceramic substrate 2 with at least one cavity is to prepare a first green sheet having a desired thickness and at least one window-like opening formed by using a suitable mold, punching with a suitable die, or machining process, such as ultrasonic machining. A second, relatively thin green sheet is further prepared to have a thickness which corresponds to that of the thin-walled region of the substrate. The second green sheet is superimposed on the first green sheet under predetermined temperature/pressure condition, and then fired and integrated with each other.

The material for the ceramic substrate 2 may contain a sintering aid, such as clay or the like. In this case, at least insofar as the second green sheet for the thin-walled region 2a is concerned, it is desirable to adjust the composition and amount of the sintering aid so that at least the sintered thin-walled region of the substrate does not contain a vitreous material such as silicone oxide, boron oxide, phosphorus oxide, germanium oxide, by an amount of 1% or more. This is because an excessive amount of vitreous material often results in undesirable reaction of the substrate material with the piezoelectric material during the heat treatment, making it difficult to control the composition of the piezoelectric material.

In the case of ceramic substrate 2 wherein the cavity 4 for defining the thin-walled region 2a has a generally square contour, it is advantageous for the cavity 4 to have dimensions which are determined such that the length of the cavity is 2–20 times larger than its width. Furthermore, for assuring a sufficient amount of displacement or force to be generated by the piezoelectric transducer 3, the transducer 3 is formed on the thin-walled region 2a of the substrate 2 over an area which preferably corresponds to 50–95% of the width of the cavity 4.

In order that the ceramic substrate 2 which has been formed as explained above permits satisfactory operational characteristics of the piezoelectric transducer 3 formed thereon, it is advantageous to control the surface roughness Ra of the substrate 2 to be within a range of 0.03–0.9 $\mu$m. In this instance, the distortion or stress occurring in the piezoelectric transducer 3 can be effectively transmitted to the substrate 2 having the above-mentioned range of the surface roughness Ra, and vice versa. Such a control of the surface roughness Ra is also effective to assure a high mechanical strength of the relatively thin substrate.

The green sheet for the ceramic substrate 2 may be subjected to sintering at a temperature of 1,000° C. to 1,800° C. prior to formation of the piezoelectric transducer 3. Alternatively, the green sheet for the ceramic substrate 2 may be subjected to a suitable film-formation process to form the piezoelectric transducer 3 and then sintered. Formation of the piezoelectric transducer 3 on the previously sintered ceramic substrate 2 is often desirable in view of minimization of warp in the final product and dimensional accuracy of the piezoelectric transducer 3.

The groove 5 in the thick-walled region 2d of the substrate 2 may be formed either in the green sheet before the sintering step or in the already sintered substrate, by various methods. For example, the groove may be formed in the sintered substrate by an appropriate process such as laser beam process, electron beam process, slicing, blasting and ultrasonic process. Furthermore, the groove may be formed in the green sheet by press or punching with a suitable die. The groove formation process may be carried out either before or after the formation of the film-type piezoelectric transducer. Among others, the laser beam process is particularly suitable in that formation of grooves with a relatively complicated shape can be carried out in a facilitated manner. In this instance, it is advantageous to pay particular attention to the process conditions so as to minimize thermal stress during the groove formation process, and thereby prevent formation of cracks in the ceramic substrate. From such a viewpoint, it has been confirmed that a suitable laser is a Nd-YAG laser having a Gaussian or normal energy distribution in the beam and using a TEM 00 single mode resonance.

Advantageously, for forming the groove in the thick-walled region of the ceramic substrate in accordance with the present invention, the laser beam process is performed by controlling the laser beam width to be 140 ns or less, preferably 100 ns or less, by carrying out a pulsation control by means of a Q-switch at a frequency of 3.6 kHz, for example, by concentrating the laser beam diameter to be 50 $\mu$m or less, preferably within a range of 5–10 $\mu$m, by means of an appropriate concentration lens system, and by performing the process at a speed of 50 mm/sec or less.

The piezoelectric transducer 3 on the ceramic substrate 2 comprising the electrode layers 3a, 3c and the piezoelectric layer 3b may be formed by a suitable film-formation process known, per se. That is to say, the film-formation process which may be applied to form the piezoelectric transducer 3 of the device 1 according to the present invention includes a thick-film formation process such as screen printing, spraying, dipping or coating, and a thin-film formation process such as ion beam method, sputtering, vacuum vapor deposition, ion plating, chemical vapor deposition (CVD) or plating. In particular, the thick-film formation process can be advantageously applied to form a film-like piezoelectric layer. This is because the thick-film formation process makes it readily possible to form a film on the ceramic substrate by using a paste or slurry whose major component is powder of piezoelectric ceramic material. In this instance, when the powder of piezoelectric ceramic material has an average particle size within a range of 0.01 $\mu$m to 5 $\mu$m, preferably 0.05 $\mu$m to 3 $\mu$m, it is readily possible to realize excellent operational characteristics of the piezoelectric device. While the pattern of such a film may be formed by screen printing method or photolithography method, the pattern may also be formed by removing unnecessary regions of the film by laser cutting, slicing, ultrasonic machining or other suitable machining process.

The present invention is not limited to the specific construction, shape and/or pattern of the piezoelectric transducer illustrated in the drawings. For example, depending upon the utility of the piezoelectric device, the transducer may have triangular, rectangular or other polygonal shape, circular, elliptical or annular shape, comb- or lattice-like pattern, or any combination of these shapes and/or patterns.

The electrode layers 3*a*, 3*c* and the piezoelectric layer 3*b* formed on the ceramic substrate 2 by a selected method as explained above may be either heat-treated in different steps for integration with the substrate each time a layer has been formed on the substrate, or simultaneously heat-treated in a single step for integration with the substrate after all the layers have been formed into a laminated structure on the substrate. When these methods are applied to manufacture the piezoelectric device as shown in FIGS. 8 and 9, it is possible to incompletely bond the edges of the piezoelectric layer 3*b* to the ceramic substrate 2. When a film-formation process is used to form the electrode layers on the substrate or piezoelectric layer, it is not always a prerequisite condition to carry out the heat-treatment for integrating the film layers with the substrate or piezoelectric layer. Thus, for example, in order to provide an enhanced insulation between the two electrode layers 3*a*, 3*c* on both sides of the piezoelectric film layer 3*b*, there may be instances wherein a coating of insulation resin or the like is provided on the periphery of the transducer 3, or wherein dummy synthetic resin layers 13 as shown in FIG. 9 are formed on the ceramic substrate 2, before formation of the upper electrode layer 3*c*. In these cases, the upper electrode layer 3*c* is preferably formed by a process which does not require heat-treatment.

The heat treatment temperature suitable for integrating the film layers 3*a*, 3*b*, 3*c* of the piezoelectric transducer 3 and the ceramic substrate 2 is generally within a range of 900–1,400° C., preferably 1,000–1,400° C. When the piezoelectric film layer 3*b* is subjected to a heat-treatment, in order to stabilize the composition of the piezoelectric material and avoid undesirable change in the composition in a high temperature condition, the heat-treatment is preferably performed while controlling the atmosphere by heating the vaporization source of the piezoelectric material as well. It is also advantageous to use a method of firing the piezoelectric film layer while it is covered by a suitable cover member for preventing a direct exposure of the piezoelectric film layer to the firing atmosphere. In this case, the cover member consists preferably of a material which is similar to the ceramic substrate material.

The lower and upper electrode layers 3*a*, 3*c* of the piezoelectric transducer 3 may be formed of any electrically conductive material which can withstand the oxidizing firing and the heat-treatment atmosphere at a considerably high temperature condition as explained above. Thus, the electrode layers may be formed of a single metal, an alloy of metals, a mixture of metal or alloy with an electrically insulating ceramic material, e.g., $TiO_2$, $Al_2O_3$, $ZrO_2$, etc., or an electrically conductive ceramic material. However, it is preferable to use an electrode material whose major component is a noble metal having a high melting point, such as platinum, palladium, or rhodium, or an alloy such as silver-palladium, silver-platinum, platinum-palladium or the like. It is more preferable to use a cermet material of platinum and the ceramic material for the substrate, a cermet material of platinum and the ceramic material for the substrate and the piezoelectric material for the piezoelectric film layer, in view of an improved adhesion of the electrode layers to the piezoelectric film layer and/or the ceramic substrate. Among others, it is more preferable to use a material having a major component which comprises a platinum.

As for additive materials to be added to the electrode material, use of vitreous material such as silicon oxide should be avoided because such material tends to react with the piezoelectric material during the heat-treatment thereby deteriorating the characteristics of the piezoelectric device. The amount of the substrate material to be added to the electrode material is preferably 5–30% by volume, and the amount of the piezoelectric material to be added to the electrode material is preferably 5–20% by volume.

The electrode layers 3*a*, 3*c* consisting of a conductive material as mentioned above may have a thickness of 20 $\mu$m or less, preferably 5 $\mu$m or less.

The piezoelectric layer 3*b* may be formed of any piezoelectric material which exhibits a relatively large amount of field-induced strain or displacement when applied with a voltage, due to the piezoelectric effect. The piezoelectric material may be either a crystalline material or an amorphous material, and may be a semi-conductive material or a dielectric or ferroelectric ceramic material. Furthermore, the piezoelectric material may either require an initial polarization or poling treatment or may not require such treatment.

Preferably, however, the piezoelectric materials which can be used in the present invention has a composition whose major component is lead zirconate titanate (PZT), lead magnesium niobate (PMN), lead nickel niobate (PNN), lead manganese niobate, lead antimony stannate, lead zinc niobate, lead titanate, lead zirconate or a mixture or solid solution thereof. Furthermore, the piezoelectric materials indicated above, whose major component is PZT or the like, may be added with a suitable amount of additives comprising an oxide or compound of lanthanum, barium, niobium, zinc, cerium, cadmium, chromium, cobalt, antimony, iron, yttrium, tantalum tungsten, nickel, manganese, lithium, strontium, calcium, and/or bismuth, so as to obtain a material whose major component is PLZT. However, addition of vitreous material such as silicon oxide should be avoided, since lead contained in the piezoelectric materials such as PZT tends to react with the vitreous material, making it difficult to achieve a desired composition of the piezoelectric film layer, thereby causing undesirable fluctuation and deterioration of the operational characteristics of the piezoelectric device.

Among the piezoelectric materials indicated above, it is preferable to use a material of which the major component comprises a mixture of lead magnesium niobate, lead zirconate and lead titanate, or a mixture of lead nickel niobate, lead magnesium niobate, lead zirconate and lead titanate. It is particularly advantageous to use a piezoelectric material of which the major component comprises a mixture of lead magnesium niobate, lead zirconate and lead titanate. Such a piezoelectric material has a particularly low reactivity with the substrate material during the heat-treatment, and is thus free from segregation of its components. Therefore, a suitable treatment for maintaining the composition serves to readily realize a desired composition or crystal structure. Furthermore, in the embodiment shown in FIGS. 8 and 9, it becomes possible to maintain the edges of the piezoelectric layer 3*b* protruding beyond the lower electrode layer 3*a* in such an incompletely bonded state with the ceramic substrate 2 for assuring a proper operation of the piezoelectric transducer 3. Moreover, such a piezoelectric material has a particularly high piezoelectric constant, and can be used as a material suitable for forming the piezoelectric film layer by the above-mentioned thick-film formation process such as screen printing, spraying, dipping, coating and the like.

While such multi-component piezoelectric material has a piezoelectric characteristic which varies depending upon the composition of components, a three-component material composed of lead magnesium niobate, lead zirconate and lead titanate, which can be suitably used in the invention, preferably has a composition in the vicinity of phase boundaries of a pseudo-cubic crystal phase, a tetragonal crystal phase and a rhombohedral crystal phase. To assure sufficiently high piezoelectric constant and electromechanical coupling factor, it is particularly advantageous to use a composition containing 15–50 mol % of lead magnesium niobate, 10–45 mol % of lead zirconate and 30–45 mol % of lead titanate.

The piezoelectric transducer comprising the electrode layers 3a, 3c and the piezoelectric film layer 3b described above generally has a thickness of 100 μm or less. To assure a relatively large amount of displacement at a relatively low voltage, the piezoelectric film layer 3b has a thickness which is preferably 50 μm or less, more preferably within a range of 3–40 μm.

In unimorph- or bimorph-type piezoelectric devices utilizing the transverse effect of the field-induced strain, when the piezoelectric material requires a poling treatment, it is a general practice to perform the treatment by applying a voltage between the upper and lower electrodes. In the case of the above-mentioned film-type piezoelectric device as in the present invention, it is preferable to perform the poling treatment with the upper electrode film layer used as a positive electrode. That is to say, in the case of the piezoelectric layer formed in accordance with the present invention, stresses generated in the piezoelectric layer during the sintering or heat treatment tend to form domains or orientations in a direction along the poling direction, which make it possible to subsequently perform an effective poling treatment.

In order to confirm the advantageous functions of the present invention, comparative experiments have been carried out with a series of samples of the piezoelectric device, each having a substrate with cavities and five piezoelectric transducers 3A, 3B, 3C, 3D and 3E of the same specification, as shown in FIG. 10. The particulars of these specimens are as follows.

Comparative sample $S_1$ has open cavities such as that shown in FIGS. 5A and 5B, and does not include grooves in the thick-walled regions of the substrate.

Comparative sample $S_2$ has closed cavities closed by a closure wall such as that shown in FIGS. 2A and 2B, and does not include grooves in the thick-walled regions of the substrate.

Comparative sample $S_3$ has open cavities and includes shallow grooves in the thick-walled regions of the substrate, wherein each groove is arranged between adjacent transducers and has a depth which is substantially same as the thickness of the thin-walled region of the substrate.

Sample of the invention $S_4$ has closed cavities and include grooves in the thick-walled regions of the substrate, as shown in FIGS. 2A and 2B, wherein each groove is arranged between adjacent transducers and has a depth of 100 μm which is greater than the thickness of the thin-walled region of the substrate.

Sample of the invention $S_5$ has closed cavities and include grooves in the thick-walled regions of the substrate, as shown in FIGS. 2A and 2B, wherein each groove is arranged between adjacent transducers and has a depth of 50 μm which is greater than the thickness of the thin-walled region of the substrate.

Sample of the invention $S_6$ has closed cavities and include grooves in the thick-walled regions of the substrate, wherein two grooves are arranged between adjacent transducers as shown in FIG. 7, each having a depth of 100 μm which is greater than the thickness of the thin-walled region of the substrate.

Each sample includes a substrate comprising a layer forming the peripheral wall of the cavity and having a thickness of 150 μm, which may be combined with a closure wall of a thickness of 150 μm, wherein the thickness of the thin-walled region is 10 μm.

In the first place, using the comparative samples $S_1$ and $S_2$ and the sample of the invention $S_4$, which were operated at the input voltage of 30V, the vertical displacement or deflection and relative dielectric constant were measured with respect to the piezoelectric transducer 3C arranged at the center of the substrate. The measurement of the vertical displacement amount of the center transducer 3C has been carried out using a laser Doppler-type vibrometer. The result of the measurement is shown in Table 1 below.

TABLE 1

| Type of Sample | Vertical Displacement (μm) | Relative Dielectric Constant |
|---|---|---|
| $S_1$ | 0.29 | 2,700 |
| $S_2$ | 0.21 | 2,500 |
| $S_4$ | 0.28 | 3,400 |

It can be appreciated from Table 1 that, with reference to the comparative sample $S_2$ and the sample $S_4$ of the invention, both including a substrate with closed cavities, the vertical displacement amount achieved by the center transducer 3C of the sample $S_4$ is higher than that achieved by the center transducer 3C of the comparative sample $S_2$. With further reference to the sample $S_4$ of the invention and the comparative sample $S_1$ which includes a substrate with open cavities, even though the substrate of the sample $S_4$ includes closed cavities, the vertical displacement amount achieved by the center transducer 3C of the sample $S_4$ is substantially as high as that achieved by the center transducer 3C of the comparative sample $S_1$. Moreover, the transducer of the sample $S_4$ according to the invention exhibits the highest relative dielectric constant. This is believed due to the minimized residual stresses in the piezoelectric film layer and improved material characteristics thereof, both realized by the formation of the grooves in the thick-walled regions of the substrate and the resultant increased compliance of the thin-walled regions.

Experiments have been carried out with respect to the samples $S_1$ to $S_6$, to quantitatively measure the magnitude of interaction or crosstalk between adjacent piezoelectric transducers. This magnitude is defined as reduced displacement rate $D_{red}(\%)$, and expressed by the following formula:

$$D_{red} = \frac{Dn_{(3A-3E)}}{Dn_{(3n)}} \times 100 \, (\%) \quad (n = A, B, C, D, E)$$

where $Dn_{(3A-3E)}$ is the displacement amount of transducer 3n when all the transducers 3A–3E are simultaneously in operation, and $Dn_{(3n)}$ is the displacement amount of the transducer 3n when only that transducer is in operation. Table 2 below shows the reduced displacement rate $D_{red}(\%)$ for each transducers of the samples $S_1$ to $S_6$.

TABLE 2

| Type of Sample | Reduced Deflection Rate $D_{red}$ (%) of Transducers | | | | |
|---|---|---|---|---|---|
| | 3A | 3B | 3C | 3D | 3E |
| $S_1$ | 62 | 55 | 49 | 52 | 60 |
| $S_2$ | 85 | 75 | 70 | 74 | 85 |
| $S_3$ | 86 | 75 | 72 | 74 | 85 |

TABLE 2-continued

| Type of | Reduced Deflection Rate $D_{red}$ (%) of Transducers | | | | |
|---|---|---|---|---|---|
| Sample | 3A | 3B | 3C | 3D | 3E |
| $S_4$ | 95 | 90 | 89 | 91 | 94 |
| $S_5$ | 90 | 81 | 81 | 82 | 91 |
| $S_6$ | 97 | 95 | 94 | 94 | 98 |

It can be appreciated from Table 2 that, with reference to the comparative samples $S_1$ to $S_3$, simultaneous operation of adjacent transducers tends to reduce the displacement of each transducer and enhance the fluctuation of the reduced displacement rate $D_{red}$. In contrast, with reference to the samples $S_4$ to $S_6$ of the invention, simultaneous operation of adjacent transducers does not result in a significant reduction of the displacement of each transducer and fluctuation of the reduced displacement rate $D_{red}$. Thus, the present invention makes it possible to suppress the interaction or crosstalk between adjacent piezoelectric transducers. With reference to the comparative samples $S_2$ and $S_3$, suppression of the interaction or crosstalk between adjacent piezoelectric transducers is still insufficient in the case of grooves of which the depth is substantially same as the thickness of the thin-walled regions. With reference to the samples $S_4$ and $S_5$ of the invention, a greater depth of the groove serves to more effectively suppress the interaction or crosstalk between adjacent piezoelectric transducers. With further reference to the samples $S_4$ and $S_6$ of the invention, formation of two grooves between adjacent transducers results in even more effective suppression of the interaction or crosstalk between adjacent piezoelectric transducers.

It will be readily appreciated from the foregoing detailed description that the piezoelectric device according to the present invention features the formation of at least one groove in the relatively thick-walled region of the substrate adjacent to and surrounding the peripheral wall of the cavity. It is thus possible to provide a higher compliance of the relatively thick-walled substrate region adjacent to the peripheral wall of the cavity, with which the thin-walled regions of the substrate can be readily deformed upon firing shrinkage during manufacture of the device. Therefore, despite the difference in the coefficient of thermal expansion of the materials for the substrate and the piezoelectric transducer, the transducer during manufacture of the device can be subjected to the firing shrinkage in a relatively unrestricted sense, thereby minimizing the residual stresses in the transducer and assuring a highly improved operational characteristics of the device.

Moreover, when the piezoelectric device according to the present invention includes an array of piezoelectric transducers formed on a common substrate, the grooves in the relatively thick-walled region of the substrate serves to effectively eliminate or suppress interaction or crosstalk between the transducers, and makes it readily possible to uniformly achieve a desired amount of displacement of the thin-walled regions of the substrate in a direction perpendicular to the general surface of the substrate.

While the present invention has been described with reference to some preferred embodiments, they were given by way of examples only. It is of course that various changes and modifications may be made without departing from the scope of the present invention as defined by the appended claims.

What is claimed is:

1. A method of manufacturing a piezoelectric device comprising (i) a ceramic substrate having at least one a cavity therein defined by a thin-walled diaphragm region and at least one peripheral wall having a thick-walled region surrounding the cavity; (ii) at least one film-type piezoelectric transducer formed integrally with the ceramic substrate by sintering and arranged on an outer surface of said thin-walled diaphragm region, wherein said film-type piezoelectric transducer is comprised of a material that is different from a material of said ceramic substrate, said method comprising the step of:

relieving residual stresses in the piezoelectric transducer arising from a difference in shrinkage between said ceramic substrate and said piezoelectric transducer as a result of said sintering, by forming, after integration of said at least one film-type piezoelectric transducer with said ceramic substrate by said sintering, at least one groove that extends into said thick-walled region along said peripheral wall.

2. The method according to claim 1, wherein said groove is formed so as to permit simultaneous displacements of said thin-walled diaphragm region and said thick-walled region between said cavity and said groove, to thereby cause a volumetric change of said cavity.

3. The method according to claim 1, wherein said groove has a depth that is greater than the thickness of said thin-walled diaphragm region.

4. The method according to claim 1, wherein said at least one groove is formed by a laser beam process.

5. The method according to claim 4, wherein said laser beam process is performed by using a Nd-YAG laser having a Gaussian energy distribution in the beam and using a TEM 00 single mode resonance.

6. The method according to claim 4, wherein said laser beam process is performed by controlling a pulse width of the laser beam to be 140 ns or less.

7. The method according to claim 6, wherein said laser beam process is performed by controlling the pulse width to be 100 ns or less.

8. The method according to claim 4, wherein said laser beam process is performed by carrying out a pulsation control by means of a Q-switch at a predetermined frequency.

9. The method according to claim 4, wherein said laser beam process is performed by concentrating the laser beam diameter to be 50 μm or less.

10. The method according to claim 9, wherein said laser beam process is performed by concentrating the laser beam diameter to be within a range of 5–10 μm.

11. The method according to claim 9, wherein said laser beam process is performed at a speed of 50 mm/sec or less.

12. The method according to claim 1, wherein said groove is formed to have a length that is at least ⅛ of the length of a longitudinal edge of the cavity.

13. The method according to claim 12, wherein said groove is formed to have a length that is at least ¼ of the length of the longitudinal edge of the cavity.

* * * * *

UNITED STATES PATENT AND TRADEMARK OFFICE
CERTIFICATE OF CORRECTION

PATENT NO. : 6,584,660 B1
DATED : July 1, 2003
INVENTOR(S) : Natsumi Shimogawa et al.

It is certified that error appears in the above-identified patent and that said Letters Patent is hereby corrected as shown below:

<u>Title page,</u>
Item [73], Assignees, change "NGK Indulators, LTD" to -- NGK Insulators, LTD --.

Signed and Sealed this

Sixteenth Day of September, 2003

JAMES E. ROGAN
*Director of the United States Patent and Trademark Office*